(12) United States Patent
Minami

(10) Patent No.: US 6,194,937 B1
(45) Date of Patent: Feb. 27, 2001

(54) SYNCHRONOUS DELAY CIRCUIT SYSTEM

(75) Inventor: Kouichirou Minami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/166,583

(22) Filed: Oct. 6, 1998

(30) Foreign Application Priority Data

Oct. 6, 1997 (JP) .................................................... 9-272289

(51) Int. Cl.$^7$ .................................................... H03H 11/26
(52) U.S. Cl. .......................... 327/270; 327/261; 327/276
(58) Field of Search ..................................... 327/261, 262, 327/263, 264, 269, 270, 271, 276, 277, 281

(56) References Cited

U.S. PATENT DOCUMENTS 5,699,003 * 12/1997 Saeki .................................... 327/261

FOREIGN PATENT DOCUMENTS 0 720 291 A2 3/1996 (EP) .

* cited by examiner

Primary Examiner—Tuan T. Lam
Assistant Examiner—Linh Nguyen
(74) Attorney, Agent, or Firm—McGinn & Gibb, P.C.

(57) ABSTRACT

A synchronous delay circuit system comprises an input buffer having a first delay time and receiving an external clock, a clock driver having a second delay time and for an internal clock, a dummy delay circuit having a delay time equal to a sum of the first delay time and the second delay time, a first delay circuit array formed of a predetermined number of delay circuits having a predetermined delay time, for measuring a time difference of a constant period from an output of the dummy delay circuit, a second delay circuit array formed of a predetermined number of delay circuits having a predetermined delay time, for reproducing the measured time difference to output the reproduced time difference to the clock driver, a circuit for measuring the frequency of the external clock to output a frequency measurement signal, and a delay time control circuit responding to the frequency measurement signal to control the traveling speed of a pulse or a signal edge in the first delay circuit array and in the second delay circuit array thereby to control the above mentioned predetermined delay time.

17 Claims, 11 Drawing Sheets

SYNCHRONOUS DELAY CIRCUIT SYSTEM

BACKGROUND OF THE INVENTION

1. Field of the Invention

The present invention relates to a semiconductor integrated circuit, and more specifically to a synchronous delay circuit system including a synchronous delay circuit formed in a semiconductor integrated circuit and having a function of controlling a delay time of the clock signal.

2. Description of Related Art

In the prior art, a synchronous delay circuit, capable of removing a clock skew for a short time, is used in a high speed synchronous circuit, from the viewpoint of a simple circuit construction and a small current consumption. Examples of the prior art synchronous delay circuit are disclosed in Japanese Patent Application Pre-examination Publication No. JP-A-08-237091 (corresponding to European Patent Application Pre-examination Publication No. EP-0 720 291-A2), Toshio Yamada et al, "Capacitance coupled Bus with Negative Delay Circuit for High Speed and Low Power (10 GB/s<500 mW) Synchronous DRAMs", 1996 Symp. on VLSI Circ. pp. 112–113, Jim-Man Han et al, "Skew Minimization Technique for 256M-bit Synchronous DRAM and beyond", 1996 Symp. on VLSI Circ. pp 192–193, Richard B. Watson et al, "Clock Buffer Chip with Absolute Delay Regulation Over Process and Environment Variations", Proc. of IEEE 1992 CICC (Custom Integrated Circuits Conference) 25.2, and Yoshinori OKAJIMA et al, "Digital Delay Locked Loop and Design Technique for High-Speed Synchronous Inteface", IEICE TRANS. ELECTRON., VOL. E79-C, NO. 6, JUNE 1996 pp. 798–807. The content of these documents is incorporated by reference in their entirety into this application.

FIG. 7 is a circuit diagram illustrating a basic construction of the synchronous delay circuit system in accordance with the first prior art example. This synchronous delay circuit system includes an input buffer 3 having a first delay time td1 and receiving an external clock CLK1 having a clock period tCK, a clock driver 4 having a second delay time td2 and outputting an internal clock CLK2, a dummy delay circuit 5 having a delay time td1+td2 corresponding to the sum of the first and second delay times td1 and td2 of the input buffer 3 and the clock driver 4, a first delay circuit array 1 formed of a predetermined number of delay circuits having a predetermined delay time, for measuring a time difference of a constant period from an output of the dummy delay circuit 5, and a second delay circuit array 2 formed of a predetermined number of delay circuits having a predetermined delay time, for reproducing the measured time difference to output the reproduced time difference to the clock driver 4.

Here, the dummy delay circuit 5 includes an input buffer dummy 5a which is completely the same as the input buffer 3, and a clock driver dummy 5b which is completely the same as the clock driver 4, in order to make the delay circuit arrays 1 and 3 equal to the delay times td1 and td2 of the input buffer 3 and the clock driver 4.

Each of the delay circuit arrays 1 and 2 is formed of a predetermined number of delay circuits having a predetermined equal delay time. The constant period of time is measured by the delay circuit array 1, and is reproduced by the delay circuit array 2. This function is realized by causing a signal to progress in the delay circuit array 1 during a period of time by be measured, and to causing a signal to pass in the delay circuit array 2 through delay circuits of the same number as that of the delay circuits through which the first named signal has progressed.

A system in which a signal is caused to pass in the delay circuit array 2 through the delay circuit of the same number as that of the delay circuits through which a signal has progressed in the delay circuit array 1, can be classified into two types based on whether an end of the path or the whole of the path are selected for determining the length of the delay circuit array 2. The synchronous delay circuit system applied with these methods is also divided into two, on the basis of the signal progressing directions of the delay circuit arrays, and therefore, the system can be classified into four types.

Namely, if the system is classified on the basis of the signal progressing directions of the delay circuit arrays 1 and 3, it is classified into one in which, as shown in FIG. 8 (prior art 2) and FIG. 9 (prior art 3), the respective signal progressing directions of the delay circuit arrays 1 and 2 are opposite to each other, and the number of delay circuits in the delay circuit arrays 2 is determined by an input terminal side of the delay circuit array 2, and another in which, as shown in FIG. 10, (prior art 4) and FIG. 11 (prior art 5), the respective signal progressing directions of the delay circuit array 1 and 2 are equal to each other, and the number of delay circuits in the delay circuit arrays 2 is determined by an output terminal side of the delay circuit array 2.

By classifying in this manner, the examples shown in FIG. 8 (prior art 2) and FIG. 11 (prior art 5) correspond to the example of selecting the end of the path, and the examples shown in FIG. 9 (prior art 3) and FIG. 10 (prior art 4) correspond to the example of selecting the whole of the path. Incidentally, in the example shown in FIG. 10 (prior art 4), a control circuit array 6 formed of control gates of the number corresponding to the number of the delay circuits in each of the delay circuit arrays 1 and 2 is located between the delay circuit arrays 1 and 2, and a multiplexor (MUX) 7 is located at an output side of the delay circuit array 2.

For reference, the example shown in FIG. 8 corresponds to one disclosed in JP-A-08-237091 (corresponding to EP-0 720 291-A2), and the example shown in FIG. 9 corresponds to one disclosed in Yoshinori OKAJIMA et al, "Digital Delay Locked Loop and Design Technique for High-Speed Synchronous Interface", IEICE TRANS. ELECTRON., VOL. E79-C, NO. 6, JUNE 1996 pp. 798–807. The example shown in FIG. 10 corresponds to one disclosed in Jim-Man Han et al, "Skew Minimization Technique for 256M-bit Synchronous DRAM and beyond", 1996 Symp. on VLSI Circ. pp. 192–193, and the example shown in FIG. 11 corresponds to one disclosed in Toshio Yamada et al, "Capacitance coupled Bus with Negative Delay Circuit for High Speed and Low Power (10 GB/s<500 mW) Synchronous DRAMs", 1996 Symp. on VLSI Circ. pp. 112–113.

In the above mentioned synchronous delay circuit systems, since the traveling speed of a pulse or a signal edge is a constant in the two delay circuit arrays (first delay circuit array and second delay circuit array), if the synchronous delay circuit system is used in a low frequency, the pulse or the signal edge overflows from the first delay circuit array depending upon the period of the external clock, so the synchronous delay circuit system does not operate normally.

This problem can be overcome by elongating each of the first delay circuit array beforehand, and the second delay circuit array so they have a large delay time. However, the number of delay circuits required to from each of the first delay circuit array and the second delay circuit array becomes large, so that the area occupied by the delay circuit array also becomes large, and therefore, the overall circuit scale becomes large.

SUMMARY OF THE INVENTION

Accordingly, it is an object of the present invention to provide a synchronous delay circuit system which overcomes the above mentioned defect of conventional systems.

Another object of the present invention is to provide a synchronous delay circuit system which is capable precisely operating and of ensuing a proper delay time and which can be constructed on a small scale.

The above and other objects of the present invention are achieved by a synchronous delay circuit system comprising an input buffer having a first delay time and receiving an external clock, a clock driver having a second delay time and for outputting an internal clock, a dummy delay circuit having a delay time equal to the sum of the first delay time and the second delay time, a first delay circuit array formed of a predetermined number of delay circuits having a predetermined delay time, for measuring a time difference of a constant period from an output of the dummy delay circuit, a second delay circuit array formed of a predetermined number of delay circuits having a predetermined delay time, for reproducing the measured time difference to output the reproduced time difference to the clock driver, a system status measuring means for outputting a system status measuring signal indicative of the result obtained by measuring the status of the system, and a delay time control means responding to the system status measuring signal to control the traveling speed of a pulse or a signal edge progressing in the first delay circuit array and in the second delay circuit array thereby to control the above mentioned predetermined delay time.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the synchronous delay circuit system in accordance with the present invention will be described in detail with reference to the drawings.

Figure 1:
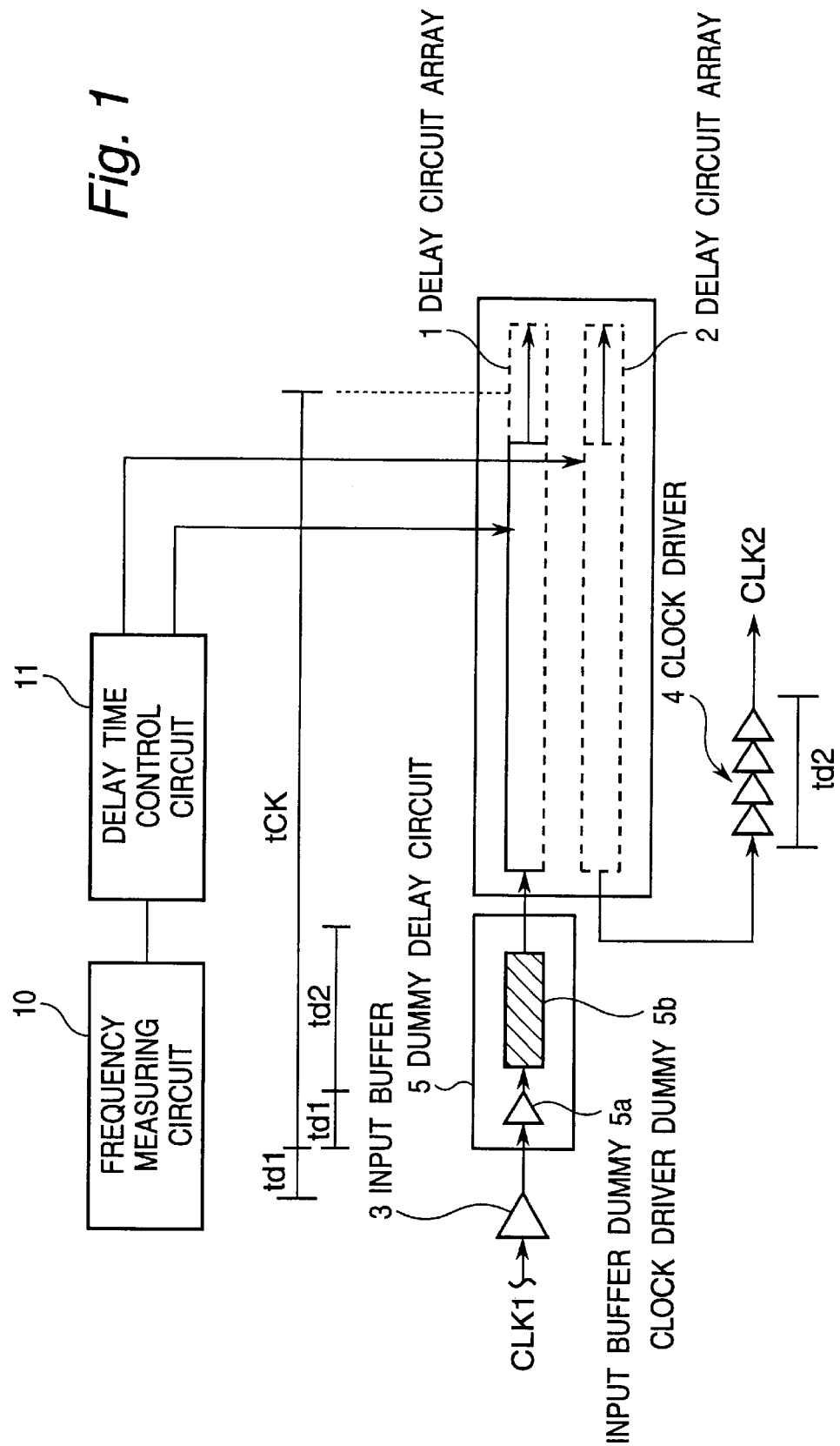
FIG. 1 is a circuit diagram illustrating a fundamental principle of the synchronous delay circuit system in accordance with the present invention.

FIG. 1 is a circuit diagram illustrating a fundamental principle of the synchronous delay circuit system in accordance with the present invention.

The shown synchronous delay circuit system includes, similarly to the prior art system, an input buffer 3 having a first delay time td1 and receiving an external clock CLK1 having a clock period tCK, a clock driver 4 having a second delay time td2 and outputting an internal clock CLK2, a dummy delay circuit 5 having a delay time td1+td2 equal to the sum of the first and second delay times td1 and td2 of the input buffer 3 and the clock driver 4, a first delay circuit array 1 formed of a predetermined number of delay circuits having a predetermined delay time, for measuring a time difference of a constant period from an output of the dummy delay circuit 5, and a second delay circuit array 2 formed of a predetermined number of delay circuits having a predetermined delay time, for reproducing the measured time difference to output the reproduced time difference to the clock driver 4.

In addition to the above mentioned constituents, the shown synchronous delay circuit system further includes a system status measuring means for outputting a system status measuring signal indicative of the result obtained by measuring the status of the system (in this example, a frequency measuring circuit 10 for outputting a frequency measurement signal indicative of the result obtained by measuring the frequency of the external clock CLK1), and a delay time control circuit 11 responding to the system status measuring signal (in this example, frequency measurement signal) to control the traveling speed of a pulse or a signal edge progressing in the first delay circuit array 1 and in the second delay circuit array 2 thereby to control the above mentioned predetermined delay time.

In the shown synchronous delay circuit system, incidentally, the dummy delay circuit 5 includes an input buffer dummy 5a which is completely the same as the input buffer 3, and a clock driver dummy 5b which is completely the same as the clock driver 4, in order to cause the input buffer dummy 5a and clock driver dummy 5b to have delay times equal to the delay times td1 and td2 of the input buffer 3 and the clock driver 4, respectively.

In the shown synchronous delay circuit system, the delay circuit arrays 1 and 2 are so configured to control the traveling speed of a pulse or a signal edge progressing in the first delay circuit array 1 and in the second delay circuit array 2, by means of an external control signal. Each of the delay circuit arrays 1 and 2 is connected to the delay time control circuit 11. In this connection, it would be apparent to persons skilled in the art that, in order to control or change the traveling speed of the pulse or the signal edge progressing in the first and second delay circuit arrays 1 and 2, the delay time of each of the delay circuits included in the delay circuit arrays 1 and 2 can be controlled or changed in various methods. For example, since the delay circuit arrays have such a feature that if the power supply voltage supplied to the delay circuit array is high, the delay time of each delay circuit becomes small, and if the power supply voltage supplied to the delay circuit array is low, the delay time of each delay circuit becomes large, the delay time of each of the delay circuits included in the delay circuit arrays can be controlled by adjusting or changing the power supply voltage supplied to each of the delay circuits included in the delay circuit array. Alternatively, if an output of each of the delay circuits is connected to the ground through a voltage-controlled variable capacitor, the delay time of each delay circuit can be controlled by adjusting a voltage applied to the voltage-controlled variable capacitor. As still another alternative, if an output of each of the delay circuits is connected to the ground through a series circuit formed of a switch means and a capacitor, the delay time of each delay circuit can be increased by turning on the switch means. In this connection, if the series circuit is replaced by a plurality of parallel-connected series circuits each formed of formed of a switch means and a capacitor, it is possible to enlarge the adjustable range of the delay time of each delay circuit.

The system status measuring means is not limited to only the frequency measuring circuit 10, but can be constituted of a voltage measuring means for generating, as the system status measuring signal, a voltage value measurement signal indicative of the result obtained by measuring a power supply voltage, or a variation measuring means for generating, as the system status measuring signal, a variation condition measurement signal indicative of the result obtained by measuring a variation of a chip device. In addition, the system status measuring means can be constituted by combining two or more of the above mentioned various measuring means.

In the shown synchronous delay circuit system shown in FIG. 1, if the external clock CLK1 having the period of tCK is inputted, the pulse or the edge of the external clock CLK1 progresses through the input buffer 3, the dummy delay circuit 5, and the first delay circuit array 1. Thereafter, if the next clock is inputted to the dummy delay circuit 5, the pulse or the edge progressing in the first delay circuit array 1 is transferred to the second delay circuit array 2.

In the prior art system, when the overall delay time of the first delay circuit array 1 is shorter than tCK-(td1+td2), the pulse or the edge progressing in the first delay circuit array 1 is not transferred to the second delay circuit array 2, with the result that the synchronous delay circuit system does not operate properly.

In the shown synchronous delay circuit system, however, in response to the frequency measurement signal obtained from the frequency measuring circuit 10 by measuring the frequency of the external clock CLK1, the delay time control circuit 11 controls the overall delay time of the delay circuit arrays 1 and 2, and therefore, the shown synchronous delay circuit system can operate properly. For example, when tCK-(td1+td2) is larger than the delay time of the first delay circuit array 1, the delay time control circuit 11 controls the delay circuit arrays 1 and 2 to enlarge the overall delay time of the delay circuit arrays 1 and 2, with the result that the delay time of the first delay circuit array 1 becomes larger than tCK-(td1+td2), and therefore, the synchronous delay circuit system becomes able to operate properly.

Accordingly, the synchronous delay circuit system can operate properly even if the frequency of the external clock is slow, by measuring the frequency of the external clock and by controlling the traveling speed of the pulse or the edge progressing in the delay circuit array.

Now, some number of specific embodiments of the synchronous delay circuit system will be described.

Embodiment 1

Figure 2:
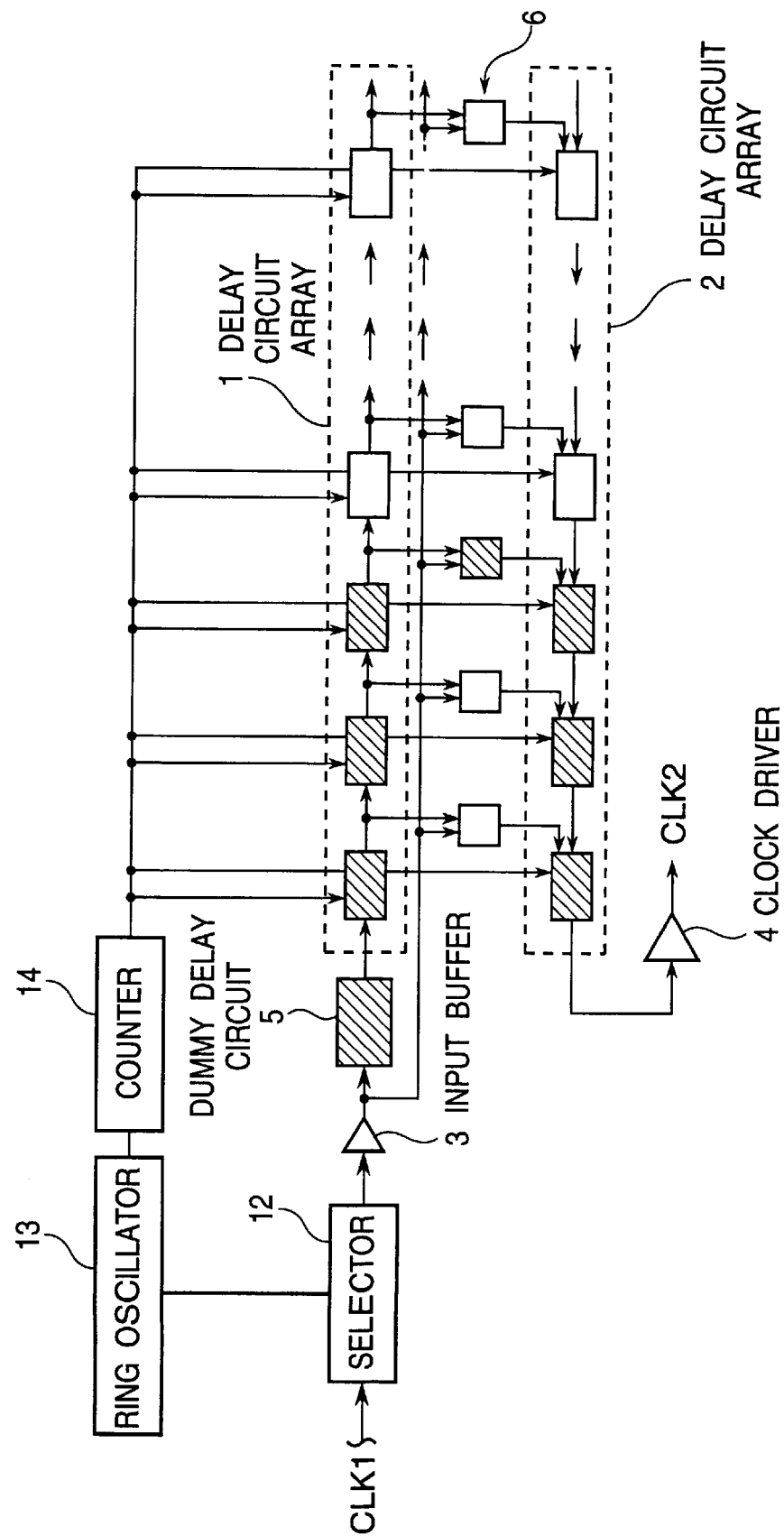
FIG. 2 is a circuit diagram illustrating the construction of a first embodiment of the synchronous delay circuit system in accordance with the present invention.

FIG. 2 is a circuit diagram illustrating the construction of a first embodiment of the synchronous delay circuit system in accordance with the present invention. In FIG. 2, elements corresponding to those shown in FIG. 1 are given the same Reference Numerals, and explanation thereof will be omitted for simplification of the description.

The first embodiment of the synchronous delay circuit system includes a control circuit array 6 which is formed of control gates of the number corresponding to the number of the delay circuits in each of the delay circuit arrays 1 and 2 and which is located between the delay circuit arrays 1 and 2. This first embodiment also includes a selector 12 located before the input buffer 3, and a ring oscillator 13 and a counter 14 which are provided as a means for measuring the frequency of the external clock CLK1. Each of the delay circuit arrays 1 and 2 are so configured to be controlled by a digital signal so as to control the traveling speed of the pulse or the edge progressing in the delay circuit array. The selector 12 is so configured to receive the external clock CLK1 and output the received external clock to only one of the ring oscillator 13 and the input buffer 12. Therefore, during a period for measuring the frequency of the external clock CLK1, the external clock CLK1 is supplied to the ring oscillator 13 by the selector 12, but is never supplied to the input buffer 3 so that the pulse or the edge is in no way supplied to the delay circuit arrays 1 and 2.

In the shown synchronous delay circuit system, if the external clock CLK1 is inputted, first, the external clock CLK1 is supplied to the ring oscillator 13 through the selector 12, so that the ring oscillator 13 is enabled to oscillate at a constant frequency during only one period of the external clock CLK1. For example, the ring oscillator 13 is enabled by the selector 12 at a leading edge of a first clock of the supplied external clock CLK, and is disabled by the selector 12 at a leading edge of a second clock of the supplied external clock CLK. The counter 14 counts up oscillation clocks generated by the ring oscillator 13 during one period of the external clock CLK1, and a count value of the counter 14 indicates, as a digital value, the frequency of the external clock CLK. Therefore, the count value of the counter 14 constitutes the frequency measurement signal. This frequency measurement signal is supplied to the delay time control means which is omitted in the Figure.

By the delay time control means which is omitted in this Figure, the traveling speed of the pulse or the edge progressing in each of the delay circuit arrays 1 and 2 is controlled in accordance with the frequency indicated by the frequency measurement signal, so as to make the delay time of the whole of each of the delay circuit arrays 1 and 2 larger than tCK-(td1+td2).

Thereafter, the selector 12 stops the supplying of the external clock to the ring oscillator 13, namely, disables the ring oscillator 13, and starts to supply the external clock to the input buffer 3, so that an ordinary synchronous delay operation is carried out. In this embodiment, the selector 12 automatically supplies only a first one of the supplied external clocks to the ring oscillator 13, namely, automatically enables the ring oscillator 13 during only one period of the external clock CLK. However, it would be a matter of course to persons skilled in the art that the selector 12 can automatically supply only a predetermined number of clocks of the supplied external clocks to the ring oscillator 13, namely, automatically enables the ring oscillator 13 during only a predetermined number of periods of the external clock CLK.

Explanation of the details of the first and second delay circuit arrays 1 and 2 and the control circuit array 6 will be omitted by referring to JP-A-08-237091 or EP-0 720 291-A2. In brief, the signal progressing direction of the first delay circuit array 1 is opposite to the signal progressing direction of the second delay circuit array 2. Each of the control gates in the control circuit array 6 has an input connected to an output of a corresponding delay circuit in the first delay circuit array 1, and an output connected to an input of a corresponding delay circuit in the second delay circuit array 2. Each of the control gates in the control circuit array 6 also has a control input connected in common to receive the output of the input buffer. In the ordinary synchronous delay operation, a first pulse of the external clock CLK1 inputted to the input buffer 3, progresses through the input buffer 3 and the dummy delay circuit 5, and in the first delay circuit array 1. Thereafter, if a second pulse of the external clock CLK1 is inputted to the input buffer 3, when the second pulse outputted from the input buffer 3 is supplied to all the control gates in the control circuit array 6, the first pulse progressing in the first delay circuit array 1 is transferred through the activated control gate to the second delay circuit array 2. Thereafter, the first pulse progresses in the second delay circuit array 2, and is outputted from the second delay circuit array 2 through the clock driver 4 as the internal clock CLK2.

In FIG. 2 and also in the other Figures, the portions through which the first pulse has passed in the above mentioned operation are hatched. As seen from the above, after the first pulse has progressed in the first delay circuit array 1 by the time of tCK-(td1+td2), the first pulse has returned in the second delay circuit array 2 by the time of tCK-(td1+td2). Therefore, the total delay time of the internal clock CLK2 is td1+(td1+td2)+tCK-(td1+td2)+tCK-(td1+td2)+td2=2tCK. Namely, the internal clock CLK2 is in synchronism with the external clock CLK1 with a delay of 2tCK.

Embodiment 2

Figure 3:
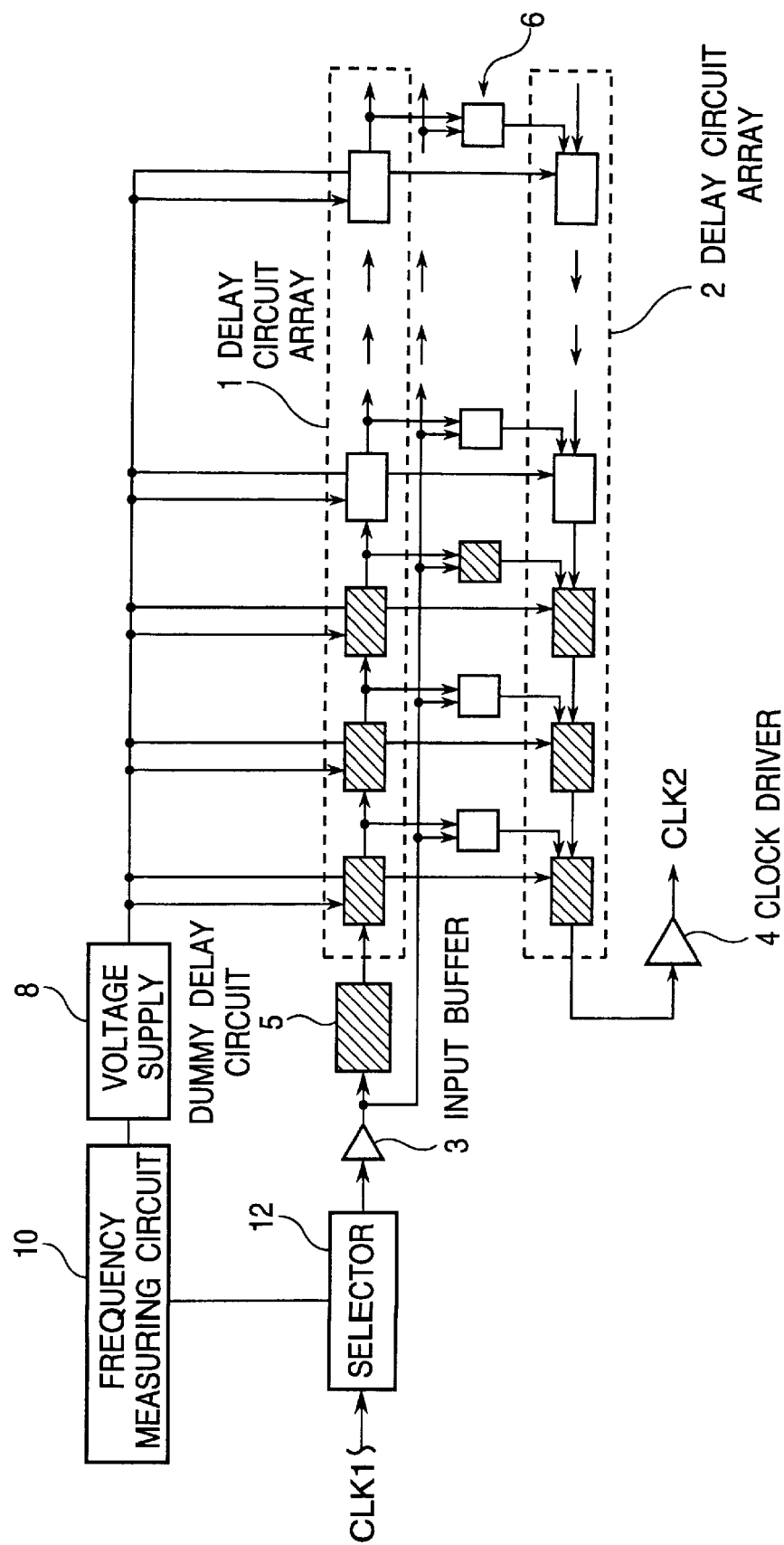
FIG. 3 is a circuit diagram illustrating the construction of a second embodiment of the synchronous delay circuit system in accordance with the present invention.

FIG. 3 is a circuit diagram illustrating the construction of a second embodiment of the synchronous delay circuit system in accordance with the present invention, In FIG. 3, elements corresponding to those shown in FIG. 1 are given the same Reference Numerals, and explanation thereof will be omitted for simplification of the description.

The second embodiment of the synchronous delay circuit system includes a control circuit array 6 which is formed of control gates of the number corresponding to the number of the delay circuits in each of the delay circuit arrays 1 and 2 and which is located between the delay circuit arrays 1 and 2. This second embodiment also includes a selector 12 located before the input buffer 3, and a frequency measuring circuit 10 provided as a means for measuring the frequency of the external clock CLK1 and connected to a voltage supply 8 as the delay time control circuit for controlling the traveling speed of the pulse or the edge progressing in the delay circuit arrays. Each of the delay circuit arrays 1 and 2 are so configured to be controlled by a voltage signal so as to control the traveling speed of the pulse or the edge progressing in the delay circuit array. The selector 12 is so configured to receive the external clock CLK1 and to output the received external clock to only the frequency measuring circuit 10 during a period for measuring the frequency of the external clock CLK1. Namely, during the frequency measuring period, the external clock CLK1 is never supplied to the input buffer 3 so that the pulse or the edge is in no way supplied to the delay circuit arrays 1 and 2.

In the shown synchronous delay circuit system, if the external clock CLK1 is inputted first, the external clock CLK1 is supplied to the frequency measuring circuit 10 through the selector 12, so that the frequency measuring circuit 10 generates, as a digital value, a frequency measurement signal indicative of the frequency of the external clock CLK. This frequency measurement signal is supplied to the voltage supply 8, where the frequency measurement signal is converted to a voltage signal. This voltage signal is supplied to the delay time control means which is omitted in this Figure.

By the delay time control means which is omitted in the Figure, the traveling speed of the pulse or the edge progressing in each of the delay circuit arrays 1 and 2 is controlled in accordance with the frequency indicated by the frequency measurement signal, so as to make the delay time of the whole of each of the delay circuit arrays 1 and 2 larger than tCK-(td1+td2).

Thereafter, the selector 12 stops the supplying of the external clock to the ring oscillator 13, and starts to supply the external clock to the input buffer 3, so that an ordinary synchronous delay operation is carried out.

Embodiment 3

Figure 4:
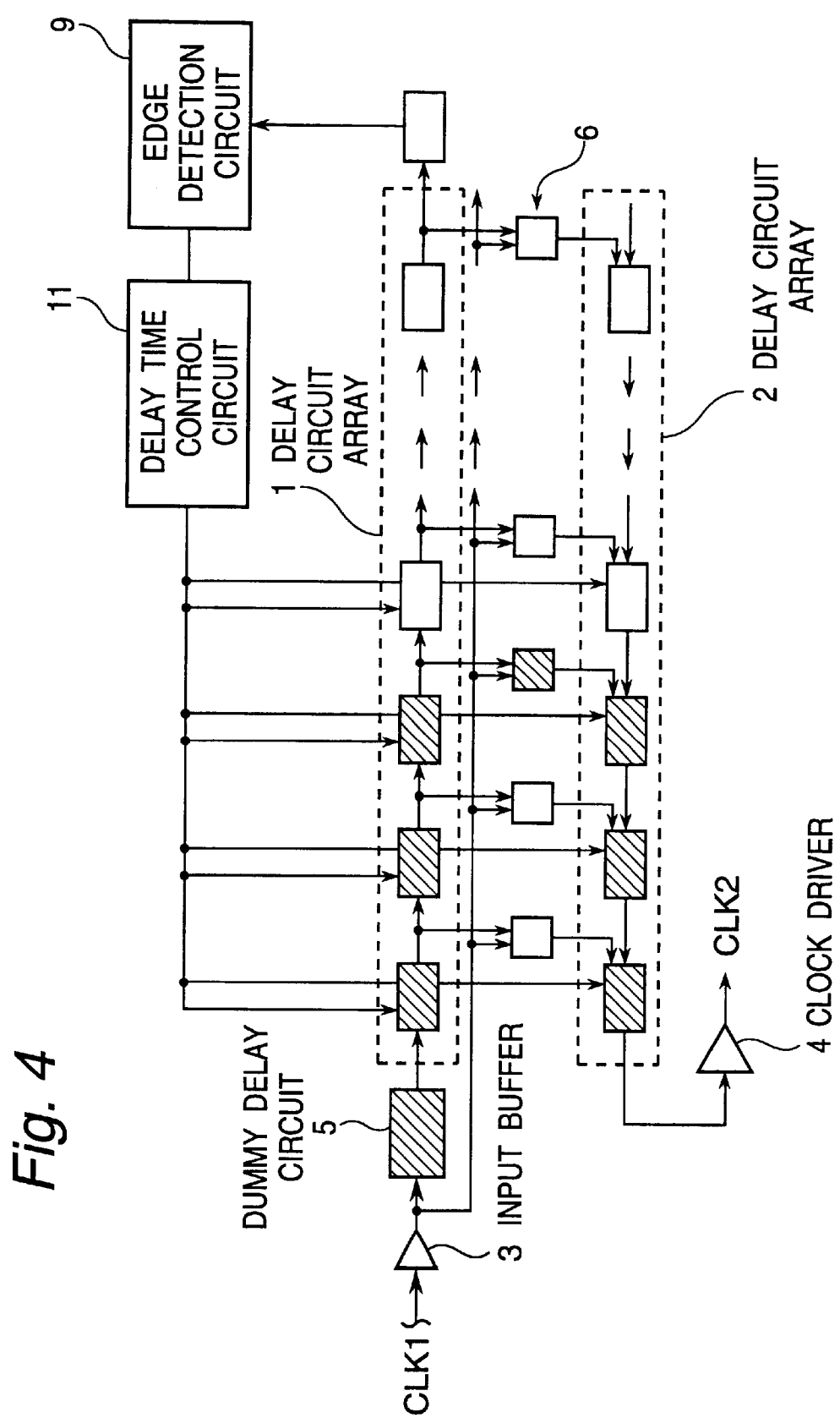
FIG. 4 is a circuit diagram illustrating the construction of a third embodiment of the synchronous delay circuit system in accordance with the present invention.

FIG. 4 is a circuit diagram illustrating the construction of a third embodiment of the synchronous delay circuit system in accordance with the present invention. In FIG. 4, elements corresponding to those shown in FIG. 1 are given the same Reference Numerals, and explanation thereof will be omitted for simplification of the description.

The third embodiment of the synchronous delay circuit system includes a control circuit array 6 which is formed of control gates of the number corresponding to the number of the delay circuits in each of the delay circuit arrays 1 and 2 and which is located between the delay circuit arrays 1 and 2. This second embodiment also includes an edge detecting circuit 9 provided as the frequency measuring means for the external clock CLK1, and a delay time control circuit 11 receiving an output of the edge detecting circuit 9 for controlling the traveling speed of the pulse or the edge progressing in the delay circuit arrays. Each of the delay circuit arrays 1 and 3 are so configured to be controlled by a digital signal so as to control the traveling speed of the pulse or the edge progressing in the delay circuit array.

In the above mentioned first and second embodiments, the frequency of the external clock CLK1 is measured before the external clock CLK1 is inputted to the delay circuit arrays 1 and 2. In this third embodiment, however, the external clock CLK1 is inputted to the delay circuit array 1 from the first pulse of the external clock CLK1, and whether or not the external pulse overflows from the delay circuit array 1 is detected by the edge detecting circuit 9.

For this purpose, the edge detecting circuit 9 is connected to receive an output of a final stage delay circuit in the first delay circuit array 1. In operation, the external clock CLK1 is supplied to the delay circuit array 1 from the first pulse of the external clock CLK1, and progresses in the delay circuit array 1 until the second pulse of the external clock CLK1 is supplied to the control circuit array 6. Therefore, if the edge detecting circuit 9 connected to receive an output of a final stage delay circuit in the first delay circuit array 1 detects a pulse, this means that the pulse outputted from the final stage delay circuit in the first delay circuit array 1 is not transferred to the second delay circuit array 2, and therefore, the delay time of the whole of each of the delay circuit arrays 1 and 2 is smaller than tCK-(td1+td2). In response to this detection of the edge detecting circuit, the delay time control circuit 11 controls the delay circuit arrays 1 and 2 so as to make the delay time of the whole of each of the delay circuit arrays 1 and 2 larger than tCK-(td1+td2). As a result, the synchronous delay circuit system starts to operate properly from a next cycle of the external clock. On the other hand, the edge detecting circuit 9 does not detect a pulse, this means that the delay time of the whole of each of the delay circuit arrays 1 and 2 is larger than tCK-(td1+td2), and therefore, the synchronous delay circuit system operates properly from the first cycle of the external clock.

Embodiment 4

Figure 5:
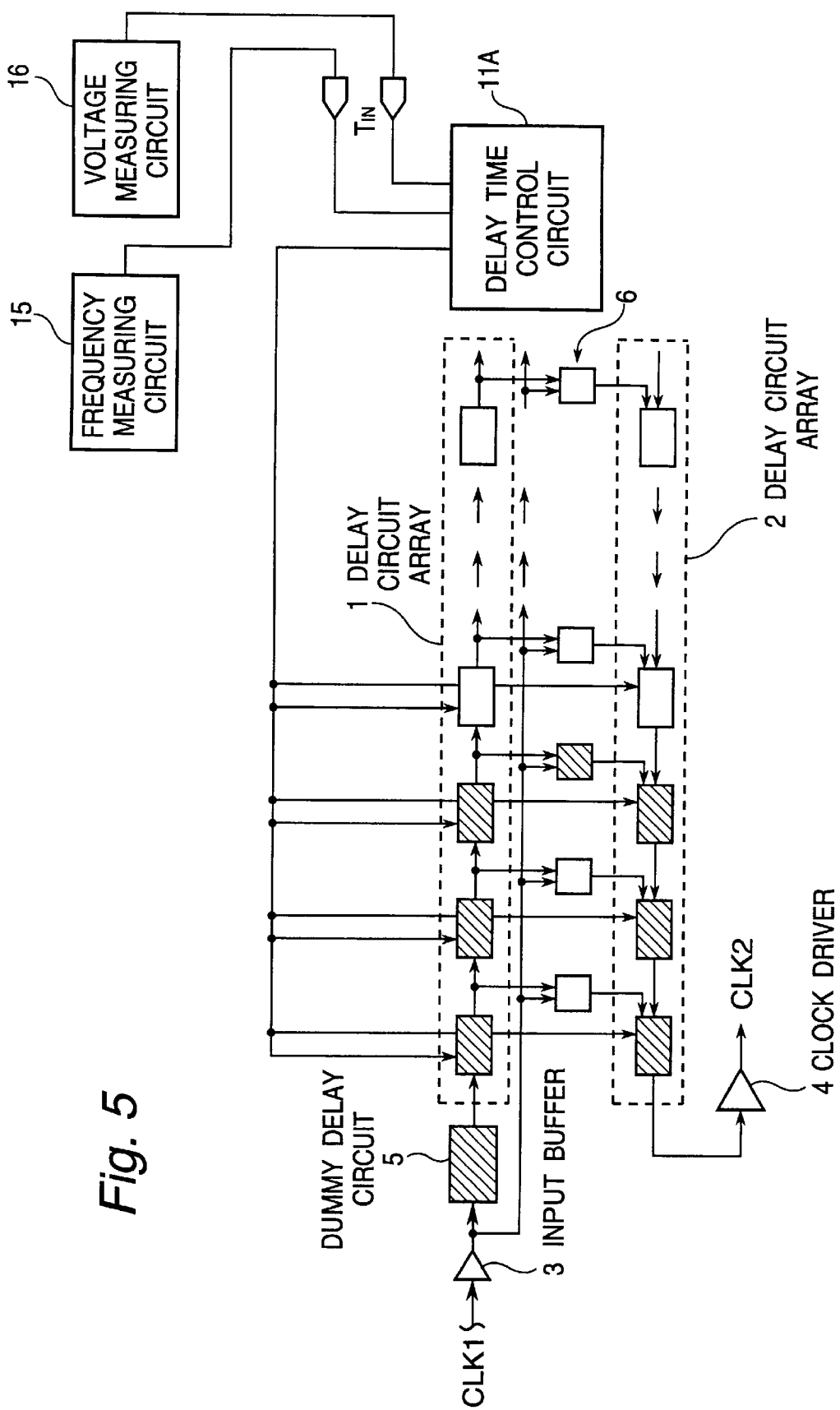
FIG. 5 is a circuit diagram illustrating the construction of a fourth embodiment of the synchronous delay circuit system in accordance with the present invention.

FIG. 5 is a circuit diagram illustrating the construction of a fourth embodiment of the synchronous delay circuit system in accordance with the present invention. In FIG. 5, elements corresponding to those shown in FIG. 1 are given the same Reference Numerals, and explanation thereof will be omitted for simplification of the description.

This fourth embodiment of the synchronous delay circuit system needs, as an external system status measuring means, a frequency measuring circuit 10 (having a function similar to the frequency measuring circuit 10 in FIG. 3, but located external to the synchronous delay circuit system) for outputting a frequency measurement signal indicative of the frequency of the external clock CLK1, and a voltage measuring circuit 15 for generating a voltage measurement signal indicative of a power supply voltage supplied to the synchronous delay circuit system. The fourth embodiment includes a delay time control circuit 11A receiving the frequency measurement signal and the voltage measurement signal through external input terminals TIN and TIN, for controlling the traveling speed of the pulse or the edge progressing in the delay circuit arrays 1 and 2, on the basis of the frequency measurement signal and the voltage measurement signal. Even in this embodiment, each of the delay circuit arrays 1 and 2 is so configured to be controlled by a digital signal so as to control the traveling speed of the pulse or the edge progressing in the delay circuit array.

The first to third embodiments are intended to overcome the problem in which the synchronous delay circuit system does not operate properly when the frequency of the external clock CLK1 is low and tCK-(td1+td2) is larger than the delay time of the whole of the delay circuit array 1. This fourth embodiment is intended to overcome a problem in which the synchronous delay circuit system does not operate properly when a plurality of power supply voltages are used. In the synchronous delay circuit system, the delay circuit arrays have such a feature that if the power supply voltage supplied to the delay circuit array is high, the delay time of the whole of the delay circuit array becomes small, and if the power supply voltage supplied to the delay circuit array is low, the delay time of the whole of the delay circuit array becomes large. Therefore, when the power supply voltage is high, if the delay time of the whole of the delay circuit array is smaller than tCK-(td1+td2), the synchronous delay circuit system can no longer operation properly. Therefore, on the basis of the frequency measurement signal and the voltage measurement signal, the delay time control circuit 11A controls the delay time of the whole of each of the delay circuit arrays.

Thus, since the delay time control circuit 11A controls the traveling speed of the pulse or the edge progressing in the delay circuit array on the basis of the frequency measurement signal and the voltage measurement signal supplied through the external input terminals TIN, the synchronous delay circuit system is controlled to operate properly even under a different power supply voltage and in accordance with the frequency of the external clock used. In other words, the synchronous delay circuit system can operate properly under a plurality of difference clock frequencies and under a plurality of different power supply voltages.

Embodiment 5

Figure 6:
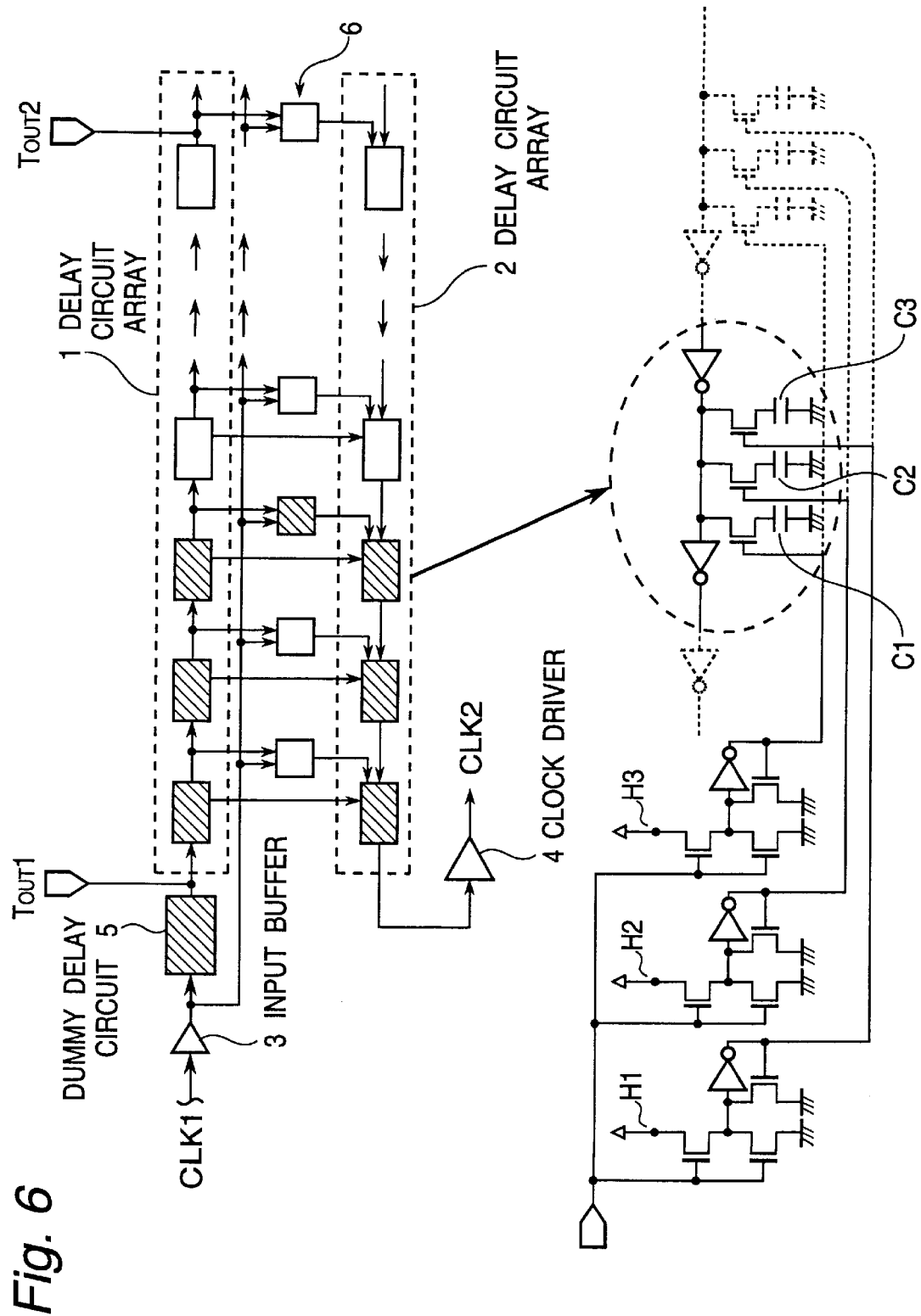
FIG. 6 is a circuit diagram illustrating the construction of a fifth embodiment of the synchronous delay circuit system in accordance with the present invention.
Figure 7:
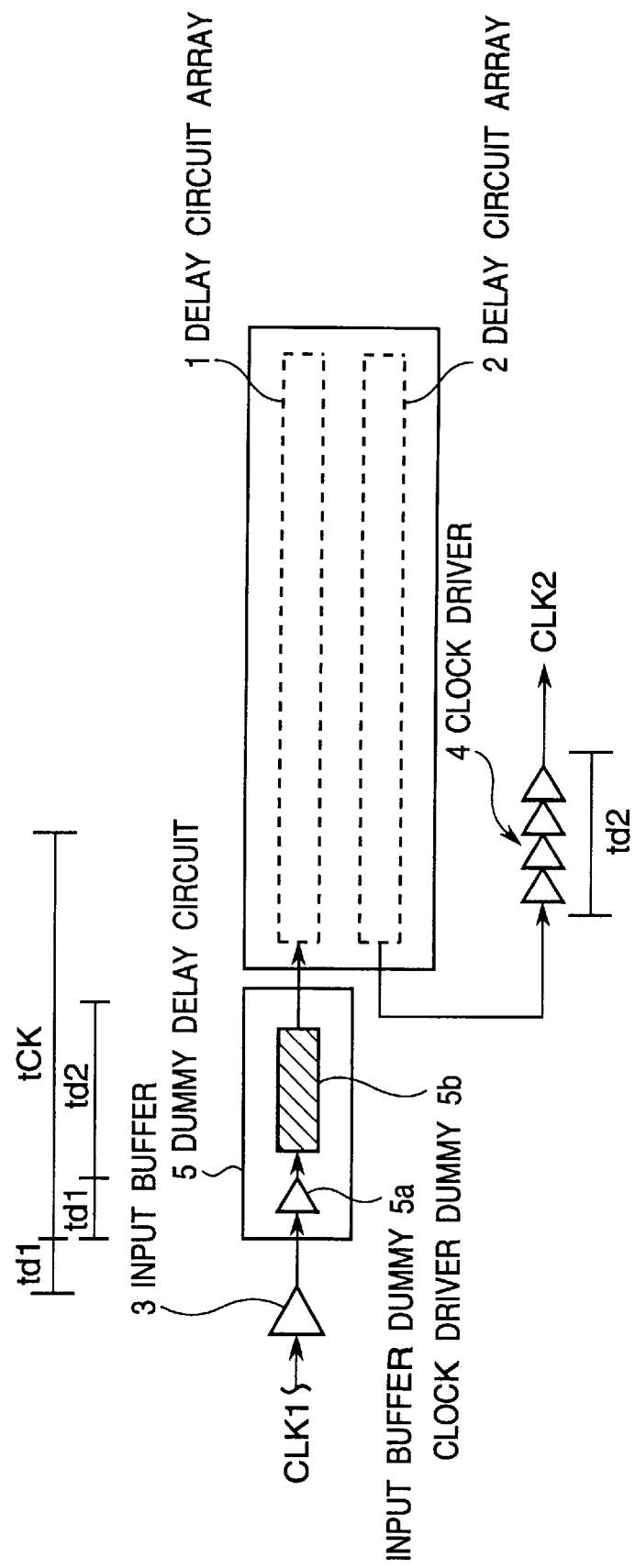
FIG. 7 is a circuit diagram illustrating the construction of an example of the synchronous delay circuit system based on the first prior art.
Figure 8:
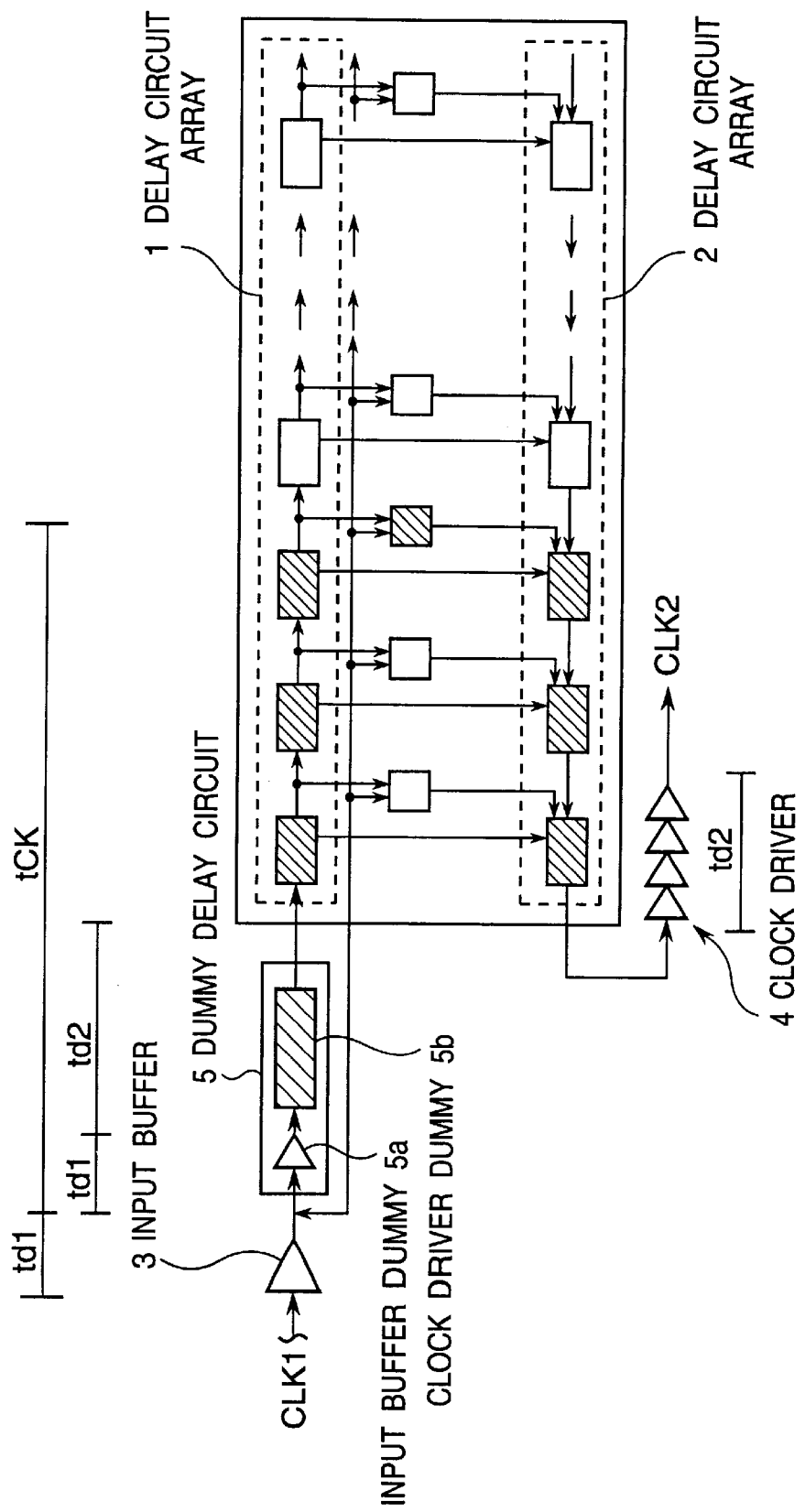
FIG. 8 is a circuit diagram illustrating the construction of an example of the synchronous delay circuit system based on the second prior art.
Figure 9:
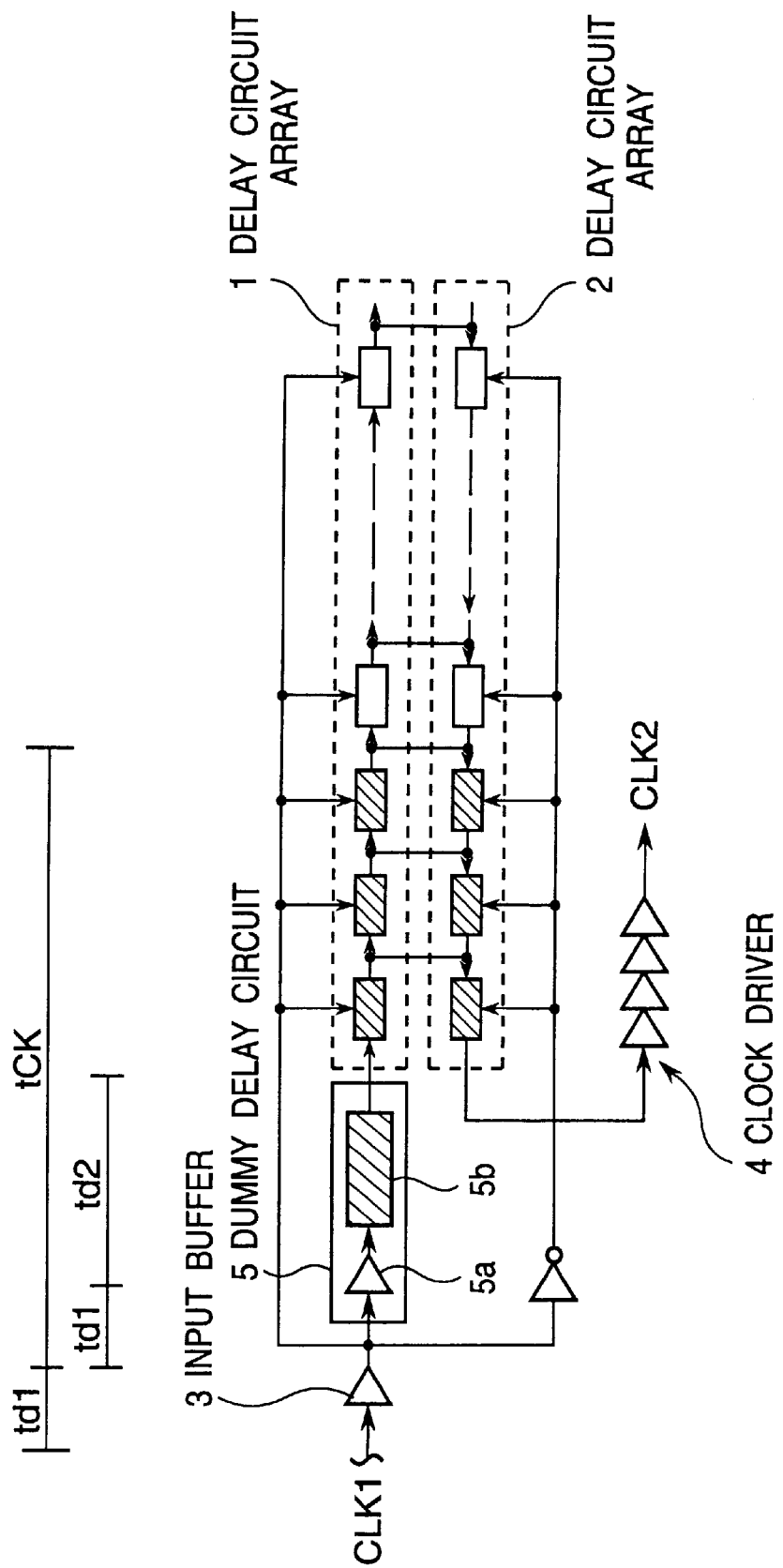
FIG. 9 is a circuit diagram illustrating the construction of an example of the synchronous delay circuit system based on the third prior art.
Figure 10:
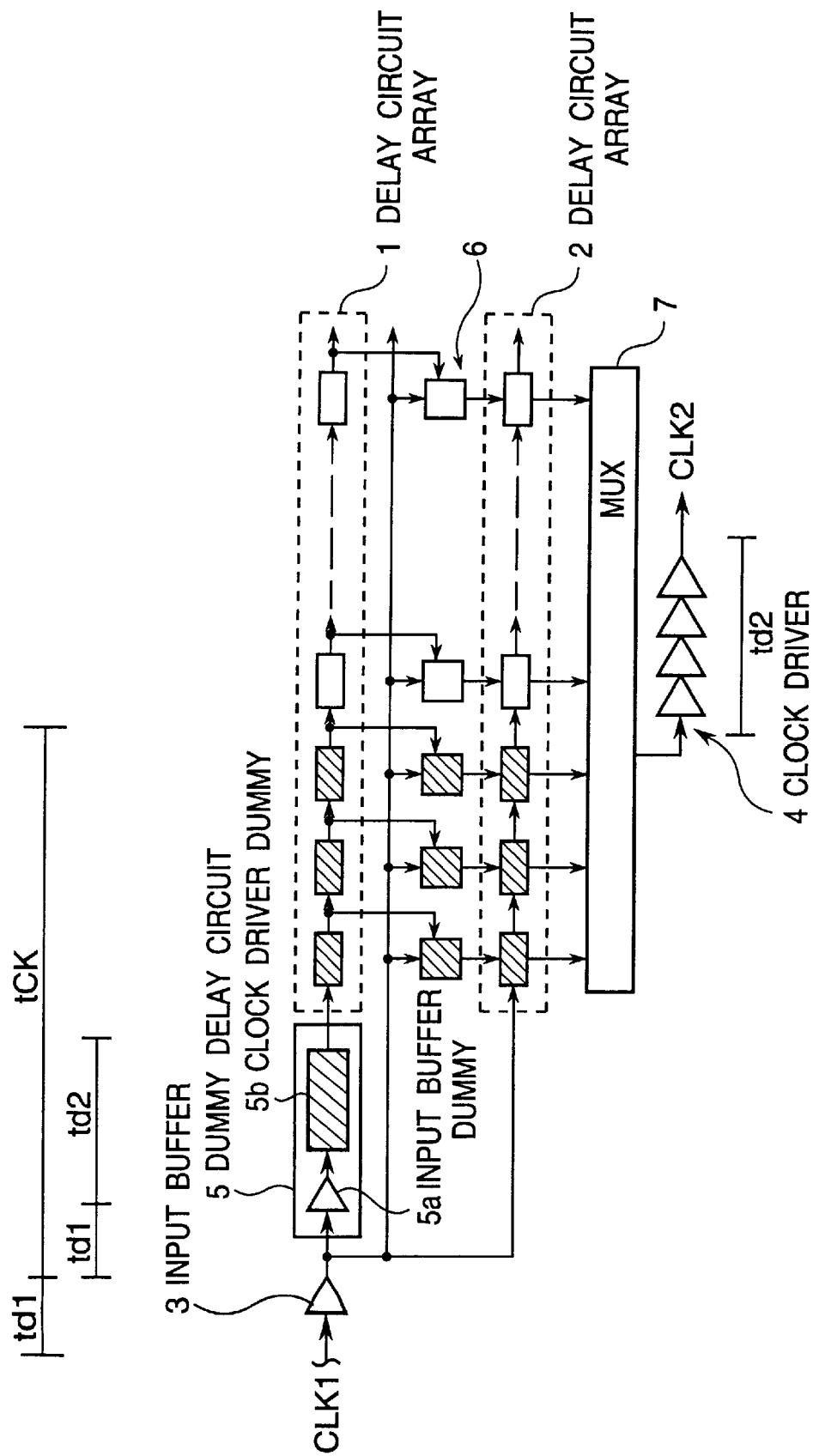
FIG. 10 is a circuit diagram illustrating the construction of an example of the synchronous delay circuit system based on the fourth prior art.
Figure 11:
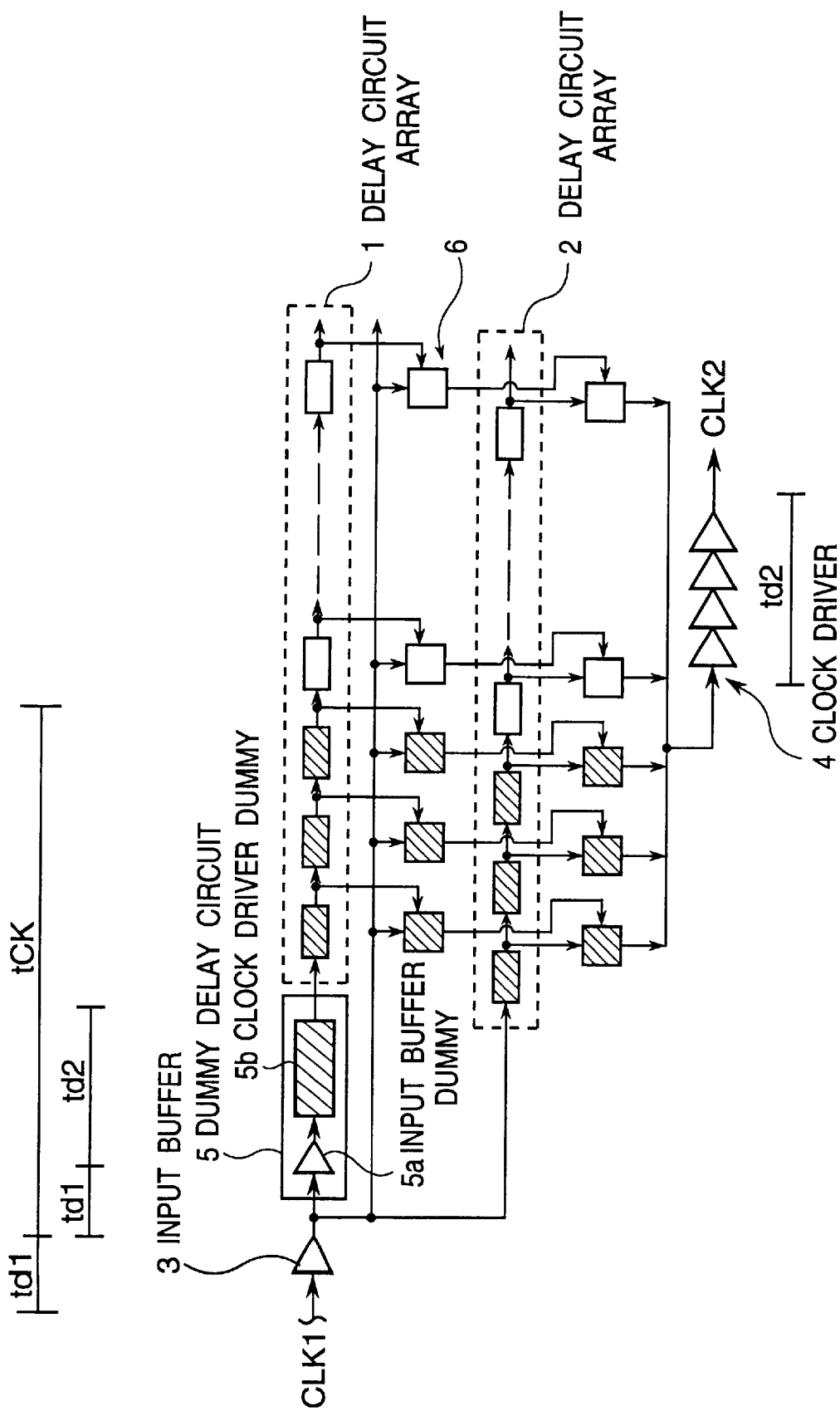
FIG. 11 is a circuit diagram illustrating the construction of an example of the synchronous delay circuit system based on the fifth prior art.

FIG. 6 is a circuit diagram illustrating the construction of a fifth embodiment of the synchronous delay circuit system in accordance with the present invention. In FIG. 5, elements corresponding to those shown in FIG. 1 are given the same Reference Numerals, and explanation thereof will be omitted for simplification of the description.

This fifth embodiment of the synchronous delay circuit system uses, as the system status measuring means, a variation measuring means for measuring a variation of a chip device. For measuring the variation of the chip device, two external output terminals TOUT1 and TOUT2 are connected to an input of the first stage and an output of the final stage in the delay circuit array 1, respectively, so that the delay time of the whole of the delay circuit array is measured from an external.

On the other hand, each of the delay circuits included in each of the first and second delay circuit arrays 1 and 2 is formed of two cascaded inverters, a connection node between the two cascaded inverters being connected to ground through three parallel-connected series circuits each composed of a switching MOS transistor and a capacitor C1, C2 or C3 for adjusting the delay time. Gates of respective switching MOS transistors of the three series circuits are respectively connected to three setting circuits each including a fuse H1, H2 or H3. These setting circuits are connected in common to the corresponding switching MOS transistors in all the delay circuits of the delay circuit arrays 1 and 2. The fuses H1, H2 and H3 included in three setting circuits are configured to be selectively cut off by an control signal from an external terminal. If the fuse H1, H2 or H3 is cut off, an output of the setting circuit including the cut-off fuse is brought to the high level, so that the corresponding switching MOS transistor is turned on, and the capacitor C1, C2 or C3 connected to the turned-on switching MOS transistor is connected to the connection node between the two cascaded inverters, with the result that the delay time of the delay circuit is increased.

In the synchronous delay circuit system, MOS transistors constituting each of the inverters included in each delay circuit are apt to have a low threshold because of a process variation, with the result that the delay time is apt to become short, namely, the traveling speed of the pulse or the edge is apt to become high. Therefore, when the clock overflows from the delay circuit array 1 with the result that the synchronous delay circuit system malfunctions, the fuses H1, H2 and H3 are selectively cut off to increase the delay time of the whole of the delay circuit array so that the synchronous delay circuit system becomes to operate properly.

If PMOS transistors or NMOS transistors constituting each of the inverters included in each delay circuit are apt to have a low threshold because of a process variation, the traveling speed of the pulse or the edge progressing in the delay circuit arrays 1 and 2 becomes high, with the result that the chip becomes defective. The fifth embodiment of the synchronous delay circuit system can make the defective chip non-defective.

Specifically, a clock CLK1 having a frequency sufficiently lower than the frequency used in a normal operation is supplied from the input buffer 3, the traveling speed of the pulse or the edge progressing in the delay circuit array, which is determined by the process variation, is measured by an external tester using the external output terminals TOUT1 and TOUT2. Whether the chip is defective or non-defective is determined by the measured result. When the chip is defective, the fuses H1, H2 are H3 are selectively cut off on the basis of the degree of defective, so as to adjust the traveling speed of the pulse or the edge progressing in the delay circuit arrays 1 and 2. As a result, the chip becomes non-defective. Incidentally, if the capacitance of the capacitors C1, C2 and C3 are set to have a relation of for example 1:2:4, it is possible to adjust the capacitance to eight different values. If four capacitors having different capacitance in the relation of 1:2:4:8, it is possible to adjust the capacitance to 16 different values.

As mentioned above, the synchronous delay circuit system in accordance with the present invention is so configured to control the delay time of the whole of each delay circuit array, on the basis of the result of the measurement of the system status such as the frequency of the external clock, the power supply voltage used, and the chip device variation. Therefore, even if the synchronous delay circuit system is used at a low frequency, the clock is prevented from overflowing from the delay circuit array, with the result that the synchronous delay circuit system can operate properly and a proper delay time can be ensured. In addition, the synchronous delay circuit system can be constructed in a small size.

The invention has thus been shown and described with reference to the specific embodiments. However, it should be noted that the present invention is in no way limited to the details of the illustrated structures but changes and modifications may be made within the scope of the appended claims.

What is claimed is:

1. A synchronous delay circuit system comprising:
   an input buffer having a first delay time and receiving an external clock;
   a dummy delay circuit, coupled to receive an output signal from said input buffer, having a delay time equal to a sum of said first delay time and a second delay time;
   a first delay circuit array including a predetermined number of delay circuits having a predetermined delay time, for measuring a time difference of a constant period from an output of said dummy delay circuit;
   a second delay circuit array including a predetermined number of delay circuits having a predetermined delay time, for reproducing the measured time difference and to output the reproduced time difference;
   a clock driver, coupled to receive said reproduced time difference, having said second delay time and outputting an internal clock;
   a delay time control means for controlling the traveling speed of a pulse or a signal edge progressing in said first delay circuit array and in said second delay circuit array, thereby to control an overall predetermined delay time of said first and second delay circuit arrays; and
   a system status measuring means, coupled to said delay time control means, for outputting a system status measuring signal indicative of the result obtained by measuring the status of the system, said delay time control means responding to said system status measuring signal to control said traveling speed.

2. The synchronous delay circuit system as claimed in claim 1, wherein said system status measuring means comprises a frequency measuring means for outputting a frequency measurement signal indicative of the frequency of said external clock, and said delay time control means controls said overall predetermined delay time on the basis of said frequency measurement signal.

3. The synchronous delay circuit system claimed in claim 1, wherein said system status measuring means comprises a voltage measuring means for outputting a voltage measurement signal indicative of a power supply voltage, and said delay time control means controls said overall predetermined delay time on the basis of said voltage measurement signal.

4. The synchronous delay circuit system claimed in claim 1, wherein said system status measuring means comprises a variation measuring means for measuring a chip device variation in a chip device connected with said synchronous delay circuit system, and said delay time control means controls said overall predetermined delay time on the basis of said measured chip device variation.

5. The synchronous delay circuit system claimed in claim 4, wherein said first and second delay circuit arrays form an overall delay circuit array, and
   wherein said first delay circuit array has two external output terminals, and each of said first and second delay circuit arrays is so configured to adjust the delay time of the overall delay circuit array by selectively cutting off a fuse with an external control signal based upon said measured chip device variation.

6. The synchronous delay circuit system claimed in claim 1 wherein said system status measuring means comprises a frequency measuring means for outputting a frequency measurement signal indicative of the frequency of said external clock, and a voltage measuring means for outputting a voltage measurement signal indicative of a power supply voltage, and said delay time control means controls said overall predetermined delay time on the basis of said frequency measurement signal and said voltage measurement signal.

7. A synchronous delay circuit system comprising:
   an input buffer having a first delay time and receiving an external clock;
   a dummy delay circuit receiving an output signal from said input buffer having a delay time equal to a sum of said first delay time and a second delay time;
   a first delay circuit array including a predetermined number of delay circuits having a predetermined delay time, for measuring a time difference of a constant period from an output of said dummy delay circuit;
   a second delay circuit array including a predetermined number of delay circuits having a predetermined delay time, for reproducing the measured time difference and to output the reproduced time difference;
   a clock driver, coupled to receive said reproduced time difference, having said second delay time and outputting an internal clock; and
   a delay time controller for controlling the traveling speed of a pulse or a signal edge progressing in said first delay circuit array and in said second delay circuit array.

8. The synchronous delay circuit system as claimed in claim 7, wherein said delay time controller controls an overall predetermined delay time.

9. The synchronous delay circuit system as claimed in claim 8, further comprising:
   a system status measuring unit, coupled to said delay time controller, for outputting a system status measuring signal indicative of the result obtained by measuring the status of the system, said delay time controller responding to said system status measuring signal to control the traveling speed.

10. The synchronous delay circuit system as claimed in claim 9, wherein said system status measuring unit comprises a frequency measuring unit for outputting a frequency measurement signal indicative of the frequency of said external clock, and said delay time controller controls said overall predetermined delay time on the basis of said frequency measurement signal.

11. The synchronous delay circuit system claimed in claim 9, wherein said system status measuring unit comprises a voltage measuring device for outputting a voltage measurement signal indicative of a power supply voltage, and said delay time controller controls said overall predetermined delay time on the basis of said voltage measurement signal.

12. The synchronous delay circuit system claimed in claim 9, wherein said system status measuring unit comprises a variation measuring device for measuring a chip device variation in a chip device connected with said synchronous delay circuit system, and said delay time controller controls said overall predetermined delay time on the basis of said measured chip device variation.

13. The synchronous delay circuit system claimed in claim 12, wherein said first and second delay circuit arrays form an overall delay circuit array, and wherein said first delay circuit array has two external output terminals, and each of said first and second delay circuit arrays is so configured to adjust the delay time of the delay circuit array by selectively cutting off a fuse with an external control signal based upon said measured chip device variation.

14. The synchronous delay circuit system claimed in claim 9, wherein said system status measuring unit comprises a frequency measuring unit for outputting a frequency measurement signal indicative of the frequency of said external clock, and a voltage measuring unit for outputting a voltage measurement signal indicative of a power supply voltage, and said delay time controller controls said overall predetermined delay time on the basis of said frequency measurement signal and said voltage measurement signal.

15. The synchronous delay circuit system claimed in claim 9, wherein said delay time controller controls an overall predetermined delay time by adjusting a voltage applied to a voltage-controlled variable capacitor.

16. The synchronous delay circuit system claimed in claim 9, wherein said first and second delay circuit arrays are connected to ground through a series circuit, said series circuit including a capacitor coupled to a transistor and a switch unit coupled to a setting circuit including a fuse, and wherein said switch unit is activated by a control signal from an external terminal to selectively increase a delay time of each of said first and second delay circuits.

17. A synchronous delay circuit system comprising:

a dummy delay circuit;

a first delay circuit array including a predetermined number of delay circuits having a predetermined delay time, for measuring a time difference of a constant period from an output of said dummy delay circuit;

a second delay circuit array including a predetermined number of delay circuits having a predetermined delay time, for reproducing the measured time difference of said constant period and to output the reproduced time difference;

a delay time controller for controlling the traveling speed of a pulse or a signal edge progressing in said first delay circuit array and in said second delay circuit array, thereby to control an overall predetermined delay time of said first and second delay circuit arrays; and a system status measuring unit, coupled to said delay time controller, for outputting a system status measuring signal indicative of the result obtained by measuring the status of the system, said delay time controller responding to said system status measuring signal to control said traveling speed.

* * * * *